United States Patent [19]

Bourassa

[11] Patent Number: 4,604,789
[45] Date of Patent: Aug. 12, 1986

[54] PROCESS FOR FABRICATING POLYSILICON RESISTOR IN POLYCIDE LINE

[75] Inventor: Ronald R. Bourassa, Colorado Springs, Colo.

[73] Assignee: Inmos Corporation, Colorado Springs, Colo.

[21] Appl. No.: 696,918

[22] Filed: Jan. 31, 1985

[51] Int. Cl.⁴ ............... H01L 21/425; H01L 21/44
[52] U.S. Cl. ............... 29/576 C; 29/576 B; 29/577 R; 29/578; 29/591; 148/187
[58] Field of Search ............ 29/578, 576 C, 576 B, 29/591, 577 R; 148/187

[56] References Cited

U.S. PATENT DOCUMENTS

| | | | |
|---|---|---|---|
| 3,576,478 | 4/1971 | Watkins et al. | 148/175 X |
| 4,110,776 | 8/1978 | Rao et al. | 148/DIG. 136 |
| 4,123,564 | 10/1978 | Ajima et al. | 148/187 X |
| 4,208,781 | 6/1980 | Rao et al. | 29/576 C |
| 4,398,335 | 8/1983 | Lehrer | 29/577 C |
| 4,446,613 | 5/1984 | Beinglass et al. | 29/571 |
| 4,462,149 | 7/1984 | Schwabe | 29/577 C |
| 4,475,964 | 10/1984 | Arizumi et al. | 29/577 C |
| 4,503,601 | 3/1985 | Chiao | 29/577 C |
| 4,541,166 | 9/1985 | Yamazaki | 29/578 X |

*Primary Examiner*—George T. Ozaki
*Attorney, Agent, or Firm*—Edward D. Manzo

[57] ABSTRACT

In making a polysilicon resistor in a polycide line, a thick oxide is established selectively to shield lightly doped polysilicon first from heavy doping and then from the silicide. Before adding silicide, a selected region of polysilicon broader than and including the site of the poly resistor is exposed, lightly doped, and then oxidized to establish a thick oxide, while other areas are protected by nitride. Then the nitride and any thin oxide on top of the polysilicon outside the broad area are removed, and the exposed polysilicon is heavily doped for low resistivity. The thick oxide shields the underlying lightly doped polysilicon from the heavy doping. Silicide is then added. Definition of the polysilicon resistor follows preferably using a two step process. When the silicide is etched, the thick oxide on top of the broad polysilicon area acts as an etch stop. Then the thick oxide and polysilicon resistor are etched.

14 Claims, 18 Drawing Figures

PROCESS FOR FABRICATING POLYSILICON RESISTOR IN POLYCIDE LINE

BACKGROUND OF THE INVENTION

The present invention relates to semiconductor fabrication. In particular, it addresses certain problems in making polysilicon resistors in a polycide line. "Polycide" is the term of art given to a multi-layered structure having a silicide, such as titanium silicide or tungsten silicide, on top of polysilicon.

Polysilicon can have a low resistance or a high resistance or resistivity, depending on how it is doped, and in current semiconductor technology, resistors often are fabricated in a polysilicon layer. The resistor can be in a word line or other line which has other parts which should be highly conductive. Thus, polycide, which can be very conductive, is used for lines in such semiconductor devices as memories. The resistor can be formed in the polysilicon part of the polycide.

A problem develops in that if one simply forms a polycide layer consisting of polysilicon covered with a silicide, and then etches off the silicide in a selective fashion to expose areas which are to be resistors, then the resistors do not, it has been observed, come out uniformly. Indeed, there are some resulting resistors which can fairly be called freaks. Evidently, there is some interaction between the silicide and the polysilicon which leads to an adverse effect.

Thus, it is the primary object of the present invention to develop a process for fabricating a reliable polysilicon resistor in a polycide environment.

Another object of the present invention is to allow the use of low resistivity silicide and high resistivity polysilicon in the same layer.

SUMMARY OF THE INVENTION

These and other objects and advantages are achieved by selectively establishing dielectric such as oxide between the silicide and the polysilicon to act as a barrier preventing interaction of the polysilicon and the silicide in the intended resistor areas.

In the preferred embodiment, a mask is used to implant an impurity into a selected region of polysilicon. The selected region is preferably broader than the resistor to be formed. The doping is relatively light, as usual for a polysilicon resistor.

Then in another aspect of the invention, the dielectric is selectively established. Preferably this is achieved by oxidizing the region where the resistor is to be formed, using nitride over other areas so that the oxidation is selective. This oxidation reduces the thickness of the lightly doped polysilicon in the region where the resistor is being formed. Areas outside the resistor region will generally not be thinned by the preferred oxidation step.

In the preferred method of practicing the invention, the entire area is heavily doped to lower the resistivity of the polysilicon. The grown oxide shields the resistor area, however, from such doping. Then the etching preferably is done in two steps. The silicide and polysilicon are etched to define the conductive polycide line, but the silicide over the broad resistive region is removed substantially entirely. The grown oxide in the resistive region acts as an etch stop. Then the resistor area is defined.

An advantage of this process involves the fact that lightly doped polysilicon will etch slower than heavily doped polysilicon. In the preferred embodiment, this is used to advantage in that the lightly doped, or even undoped, parts of the polysilicon will have been made thinner by selective oxidation. The etching completion time will be about equal for the thicker heavily doped polysilicon and the thinner lightly doped or undoped polysilicon. This prevents underlying oxide from being etched appreciably. If the underlying oxide were gate oxide, appreciable etching thereof would cause serious problems.

BRIEF DESCRIPTION OF THE DRAWINGS

In describing the present invention, reference is made to the accompanying drawings wherein.

DESCRIPTION OF A FIRST EMBODIMENT

First and second embodiments of the present process invention will be discussed. These two embodiments contain a common portion of the processing, which occurs at the beginning of the process.

Figure 1:
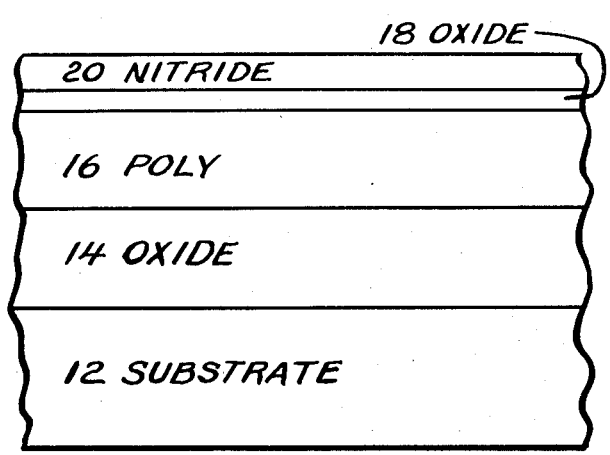
FIG. 1 illustrates an intermediate structure developed in the very early stages of a process according to a first embodiment of the present invention, and illustrates in cross-section the substrate with a layer of polysilicon and layers of thin oxide and nitride thereover.

Referring to FIG. 1, on a single crystal silicon substrate 12, a layer of gate oxide or field oxide 14 is established. Field oxide will have a thickness of about 6000 Angstroms. Then a layer 16 of polysilicon is deposited. This layer is about 6,000 Angstroms thick. Following this, a thin layer 18 of oxide (about 450 Angstroms thick) and then a layer 20 of nitride (about 1,000 Angstroms thick) are deposited. The nitride is used because of its oxidation inhibiting property, and other materials serving this function could be used.

Figure 2:
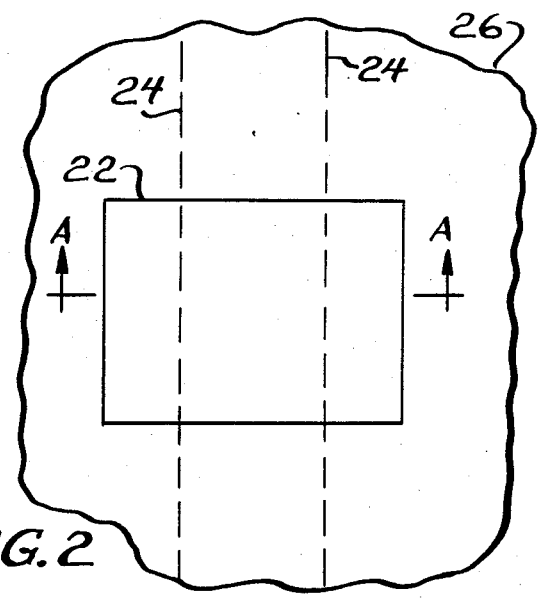
FIG. 2 illustrates in plan view a mask for a broad resistive area which encompasses a designated resistor region.

As shown in FIG. 2, which is a plan view, a broad rectangular area 22 will be established over the illustrative intended resistor area. Dotted lines 24 represent the approximate borders of what will become a polycide line (outside rectangle 22), and a resistor of polysilicon covered by oxide (substantially within rectangle 22).

Thus, within rectangle 22, dotted lines 24 show a designated resistor region. In a semiconductor static RAM, for example, ordinarily two or more polysilicon resistors will be formed, all within rectangle 22. For ease of explanation and illustration, only one polycide line and its resistor will be described, it being understood that two or more such resistors can be formed within rectangular region 22 using this process.

Figure 3:
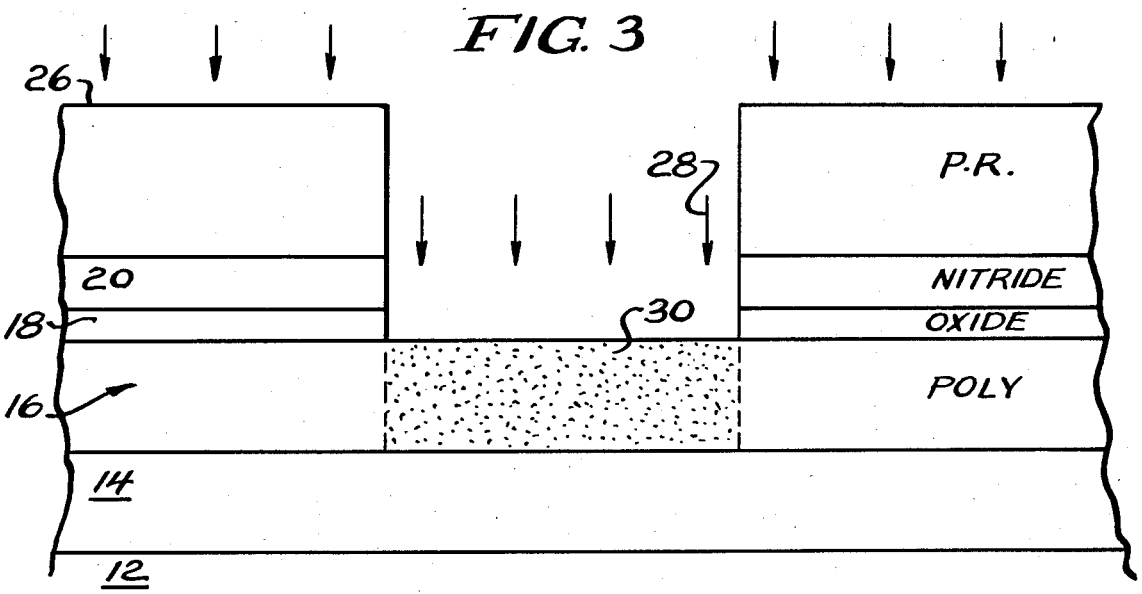
FIG. 3 is a cross-sectional view along the lines A—A of FIG. 2 after etching to show the implantation of boron into what will become a resistive region in the polysilicon.

A photoresist is placed on top of nitride layer 20 to mask all areas thereof except for rectangle 22. The photoresists used in these embodiments are about 10,000 Angstroms thick. Next, within rectangle 22, the exposed nitride 20 and then the underlying oxide 18 are etched away to expose part of the polysilicon layer 16. Then a dopant is implanted into the polysilicon exposed in rectangle 22 for what will later become a resistor. The concentration and dose are those customarily used for fabricating resistors. Phosphorus or arsenic are used if it is desired to form a standard polysilicon resistor as used by most of the industry. Boron alone or boron plus either phosphorus or arsenic is used to form back to back boron diodes or nearly compensated diodes (as disclosed in my U.S. Ser. No. 449,984 filed Dec. 15, 1982 which can also be used as resistors. In this description, boron will be used for illustration. The boron does not enter any other parts of polysilicon layer 16 appreciably except within rectangle 22 because those other parts are protected by the layer of photoresist, nitride and thin oxide 18. This doping step is illustrated in FIG. 3 which is a cross-section taken along the lines A—A of FIG. 2. FIG. 3 shows the photoresist 26 with arrows 28 indicating the boron implant into what becomes a lightly doped resistive region 30 of polysilicon layer 16. Thus it will be noted that the boron enters the designated resistor region which is within rectangle 22.

Figure 4:
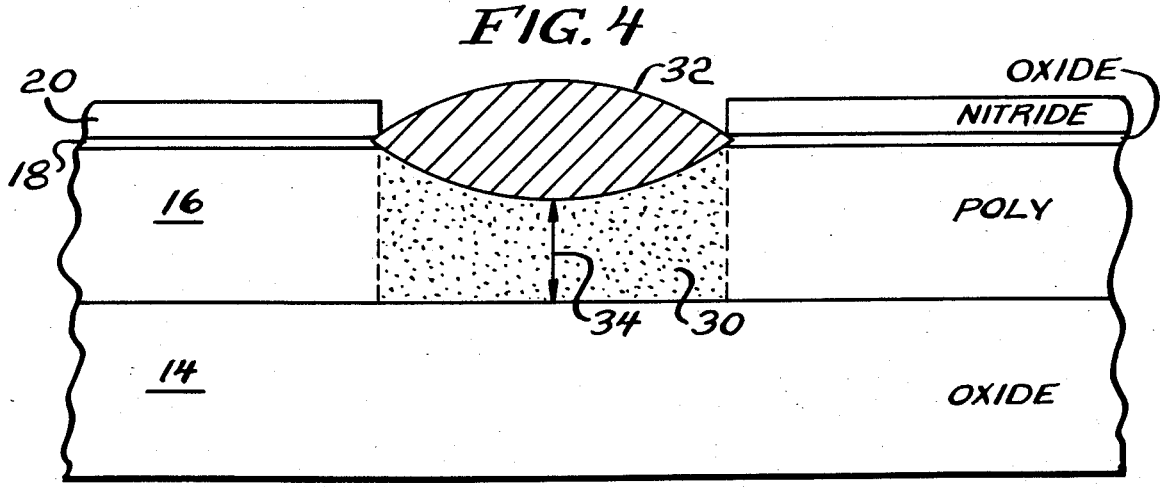
FIG. 4 illustrates the structure of FIG. 3 after the photoresist has been removed and oxide has been grown onto the broad area encompassing the designated resistor regions.

After the boron implant for the resistors into rectangular area 22, photoresist 26 is removed but the nitride 20 is left remaining outside rectangle 22. Then a thick oxide 32 is grown into the exposed polysilicon layer 16 as shown in cross-sectional view in FIG. 4. The nitride 20 restricts the oxide from growing anywhere except within rectangle 22 (FIG. 2). Oxide 32 is about 3,500 Angstroms thick and grows into layer 16 thereby to reduce its depth. Arrow 34 represents the thickness of the polysilicon remaining in rectangle 22 after thick oxide 32 is grown. Polysilicon layer 16 initially was 6,000 Angstroms thick, but after this oxidation step its depth in rectangle 22 at arrow 34 will be only on the order of 4,000 to 5,000 Angstroms. Note also that oxide 32 has a thickness of about 3500 Angstroms and rises above the surface of layer 16, as shown also in FIG. 4. The thickness of layer 16 outside rectangle 22 (i.e., outside region 30) at this time is still about 6000 Angstroms.

Next, the nitride 20 and underlying thin oxide 18 are removed, and the structure (a polysilicon layer with a relatively thick oxide 32 thereon at rectangle 22), is subjected to heavy doping, if desired, in a furnace. The dopant can be arsenic or phosphorus although arsenic is preferred. At this time, the structure has polysilicon with a boron-doped broad resistive region 30 therein, the boron-doped region being covered with a thick grown oxide 32. Outside the boron-doped region, the polysilicon is doped to be as conductive as desired. Following this, whatever minor amounts of oxide formed during the doping cycle are removed from the polysilicon, reducing its thickness by about 500 Angstroms.

Figure 5:
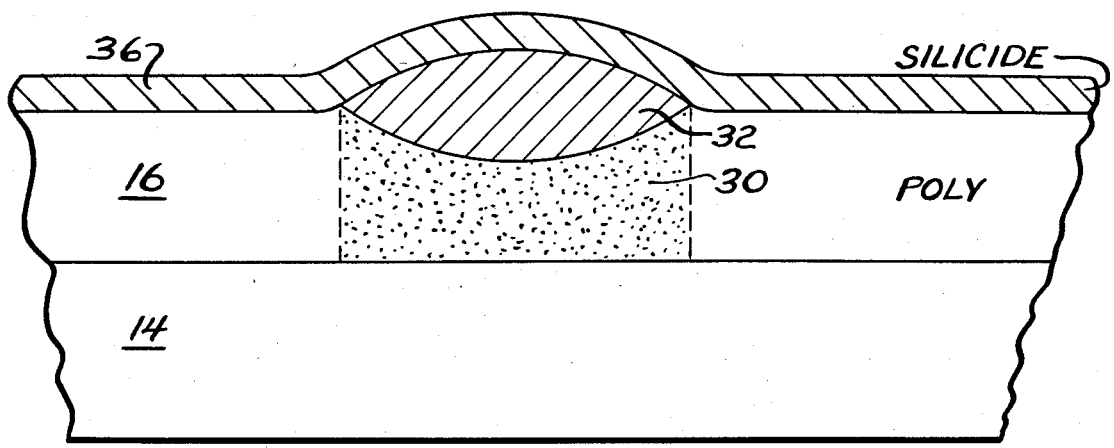
FIG. 5 illustrates the structure of FIG. 4 after the nitride and thin oxide have been removed and a layer of silicide has been added.

Next, a layer 36 of silicide is added over the entire structure (FIG. 5). Preferably, silicide layer 36 has a thickness on the order of about 2000 to 3000 Angstroms. FIG. 5 is a sectional view along the line A—A of FIG. 2 through the rectangle 22 which broadly covers the designated resistor areas. The silicide covers both this rectangle 22 which defines the resistive region, and the silicide also covers other parts of the structure.

Figure 6:
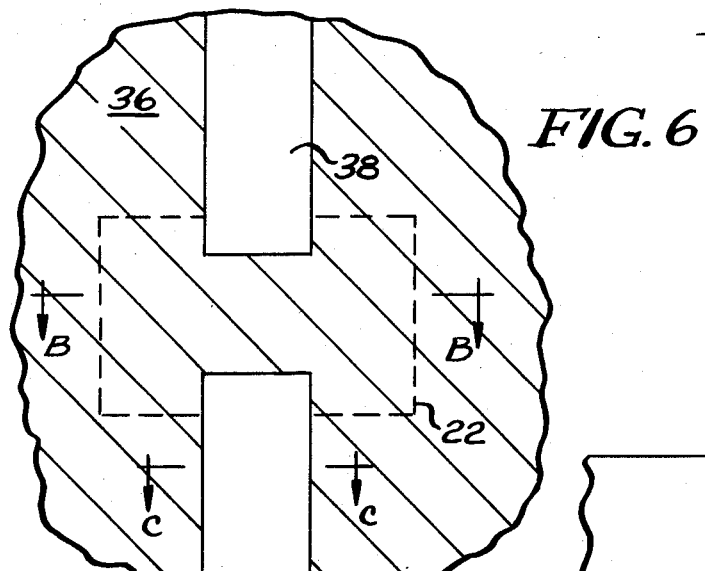
FIG. 6 illustrates a definition mask for a polycide line in plan view.

Next a polysilicon definition mask 38 of photoresist is placed on the structure (FIG. 6). Mask 38 is open generally over rectangle 22 and its designated resistor areas, and mask 38 covers what will be the polysilicon or polycide line. In FIG. 6, rectangle 22 is covered with silicide layer 36 and therefore is shown in dashed lines. Photoresist 38 of the polysilicon definition mask lies on top of the silicide.

Figure 7:
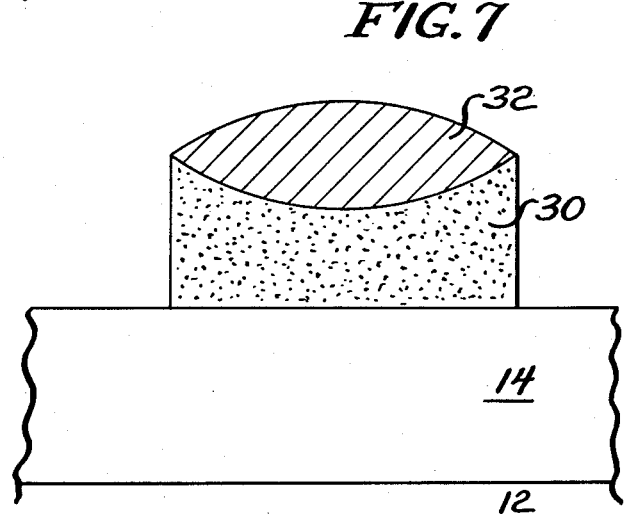
FIG. 7 is a cross-sectional view through the broad resistive region along the lines B—B of FIG. 6 after the silicide and polysilicon have been etched, leaving the doped polysilicon region covered by relatively thick oxide.
Figure 8:
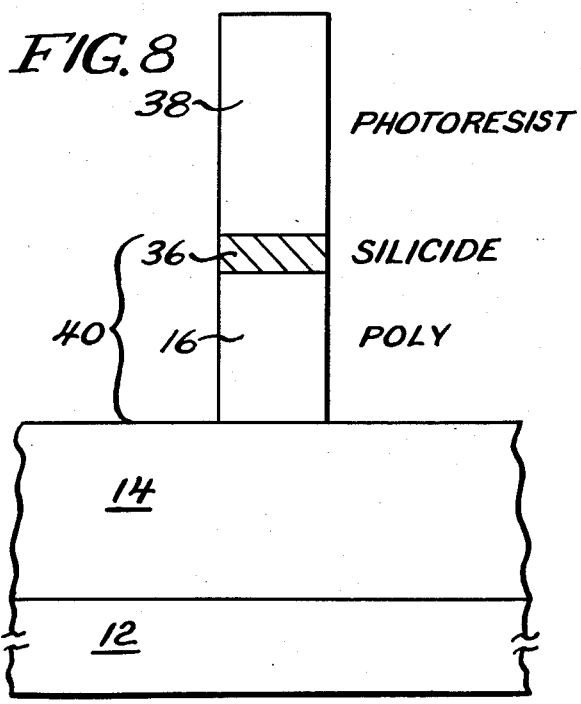
FIG. 8 illustrates a sectional view along the lines C—C of FIG. 6 to show a sectional view through the polycide line after etching.

Next the silicide 36 and underlying polysilicon 16 are etched using traditional etching processes. The thick oxide 32 coextensive with and defined by rectangle 22 acts as an etch stop so that the resistive region 30 will not be etched. FIG. 7 is a sectional view through the resistive region along lines B—B of FIG. 6 after the silicide and polysilicon etch. FIG. 8 is a sectional view through the polycide line along lines C—C of FIG. 6. As can be seen, the result after this etch is a polycide line 40 having an upper silicide portion 36 about 2500 Angstroms thick over a nominally 5500 Angstrom thick polysilicon portion 16 which will have been doped heavily for conductivity in previous steps as desired. Polycide line 40 is interrupted by a resistive region of polysilicon under rectangle 22 which is covered with a thick oxide 32. The silicide which had overlain rectangle 22 has been etched away except under the parts of mask 38 which project slightly over rectangle 22.

Figure 16:
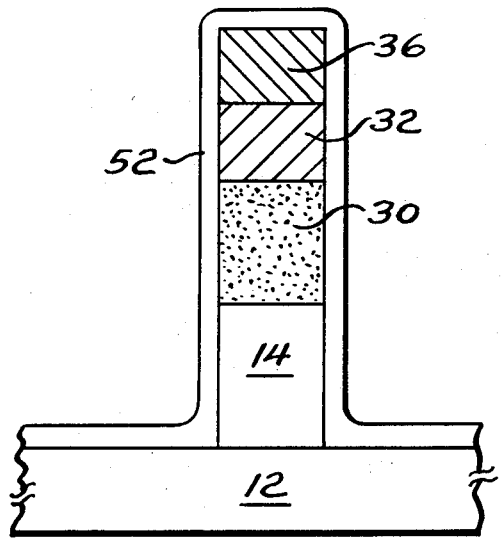
FIG. 16 illustrates the next step in the alternate embodiment of the present invention showing oxide which has been grown or deposited for a zero drain overlap process and to protect the side walls of the polysilicon resistor.

Next, the photoresist 38 is removed, and an oxide is grown or deposited preferably for the zero drain overlap process of Inmos Corporation which provides an oxide covering the top and sides of the polysilicon (polycide) being used elsewhere as a gate electrode so that source and drain implants will be offset initially but will be aligned with zero overlap after heat driving. The thick oxide 32 protects the resistive region 30 of polysilicon from arsenic implants for the source and drain regions. FIG. 16 illustrates such an oxide for zero drain overlap.

Figure 9:
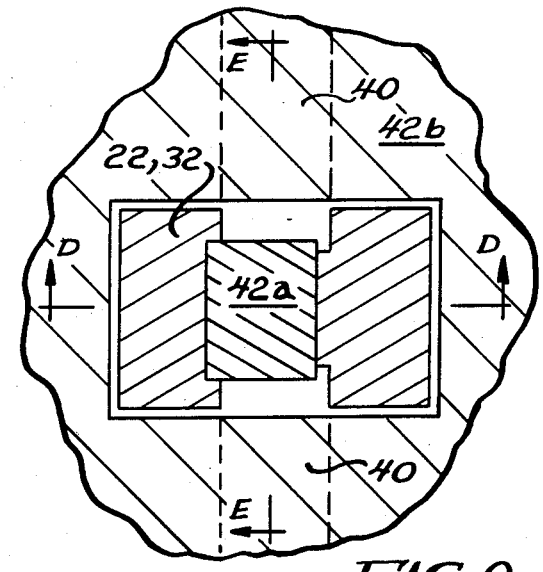
FIG. 9 illustrates in plan view the application of a separate resistor definition mask over the broad resistive regions of polysilicon covered with oxide.

The next step is to define the polysilicon resistor itself within rectangle 22. This is done by adding a photoresist mask 42 over the rectangle 22 as shown in FIG. 9. Mask 42 in this embodiment has two portions. One portion 42a is within rectangle 22 and sits on top of thick oxide 32. In FIG. 9, the polycide lines 40 are shown with photoresist 42a being partially misaligned from polycide line 40. This is to illustrate the normal tolerance in the fabrication equipment. The second part 42b of the photoresist will mask areas outside rectangle 22. The polycide line 40 is covered at this time by photoresist 42 and therefore is shown in broken lines.

Figure 10:
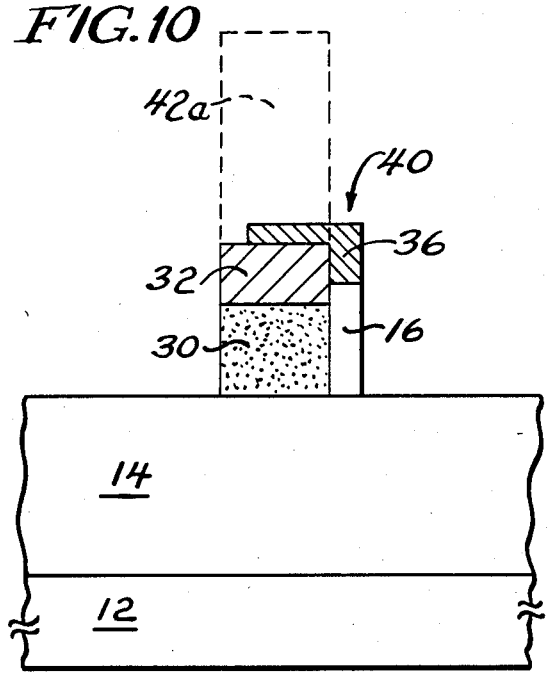
FIG. 10 is a cross-sectional view along lines D—D through the polysilicon resistor which results from etching the structure shown in FIG. 9 showing both a sectional view of the resistor as well as a portion of the polycide line in cross-section.
Figure 11:
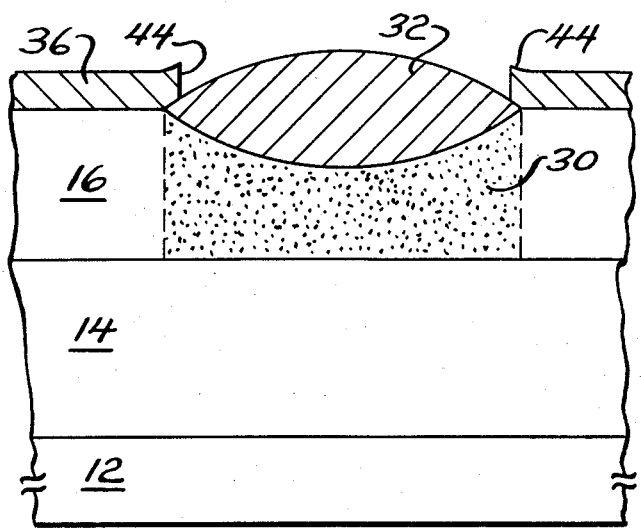
FIG. 11 is a cross-sectional view normal to FIG. 10, taken along the lines E—E of FIG. 9 to show a sectional view lengthwise of a polycide line with a polysilicon resistor therein formed according to the preferred embodiment of the present invention.

Oxide 32 and underlying boron-doped polysilicon region 30 are then etched except under photoresist 42 to result in a polycide line 40 containing a resistor in the polysilicon, the resistor being covered with a thick oxide 32. These are illustrated in FIGS. 10 and 11 which are, respectively, sectional views along lines D—D and E—E of FIG. 9 (after etching). In FIG. 10, the location where photoresist 42a of FIG. 9 had been located is shown in dashed lines. As can be seen, it is slightly displaced to the left from the polycide line 40. Note that heavily doped polysilicon 16 is thicker than lightly doped polysilicon 30. The etching is a two-step process wherein first the oxide and then the polysilicon are etched using different etchants in customary well-known fashion.

FIG. 11 shows a sectional view along the polycide line. The central portion of FIG. 11 shows the remaining thick oxide 32 covering the boron-doped resistive region 30 which has now been defined into a resistor. Outside resistive region 30 are more heavily doped, thicker conductive regions of polysilicon layer 16. These conductive regions are covered by silicide 36. As can be seen, the silicide extends partially over thick oxide 32, and this is because the polysilicon definition mask 38 partially projected into and overlapped rectangle 22 as shown in FIGS. 6 and 9. The innermost edges 44 of the silicide covering curve upward to conform with the bottom edge which rises on account of oxide 32 (see FIG. 5).

Advantages of this embodiment are that one photolithography step is used for the resistor implant, the polysilicon doping and the source-drain implants. This saves one mask in NMOS where there normally are separate polysilicon doping and implant masks.

By not cutting the actual resistor line until after the source-drain implant, there is no concern that the side wall of the resistor might be shorted in the source-drain implantation. In other words, the source-drain implantation even at the usual 7° angle is unlikely to penetrate the side walls of rectangular area 22 so that it would reach the area under photoresist 42. Thus, resistive characteristics are preserved.

Another advantage of this process is that the silicide 36 which is deposited over polysilicon is never in contact with the specific polysilicon that forms the resistors. This is because a thick oxide 32 separates the silicide from the polysilicon (see FIG. 5). Thus, there is no opportunity for the resistive region to be adversely affected by interacting with the silicide.

As explained above, another advantage is that the completion time for etching the heavily doped polysilicon is about the same as the completion time for etching the lightly doped polysilicon.

Thus, the first embodiment of the invented process can be recapitulated as follows:
1. Deposit a polysilicon layer.
2. Develop a thin oxide and then deposit nitride layer thereover (FIG. 1).
3. Define a broad area encompassing the designated resistor area. Etch through the nitride and the thin oxide to expose the polysilicon in the broad area.
4. Selectively implant boron into the polysilicon (FIGS. 2, 3).
5. Remove photoresist.
6. Selectively grow thick oxide over the broad area (FIG. 4).
7. Remove the nitride and the thin oxide.
8. Selectively dope the polysilicon outside the broad area to make it conductive except where the thick oxide masks it.
9. Remove oxide caused by doping process.
10. Deposit silicide layer over exposed polysilicon and the thick oxide (FIG. 5).
11. Add mask for defining polycide lines, leaving open the broad area (FIG. 6).
12. Etch the silicide and poly using the thick oxide on the broad area as an etch stop to leave polycide lines adjacent the broad area covered with only oxide (FIGS. 7, 8).
13. Remove photoresist.
14. Grow or deposit oxide for zero drain overlap process elsewhere in device.
15. Implant source and drain impurities using the thick oxide over the broad area as a mask.
16. Add resistor definition mask (FIG. 9).
17. Etch thick oxide and underlying poly to leave defined resistor between polycide lines (FIGS. 10, 11).

DESCRIPTION OF A SECOND EMBODIMENT

Figure 12:
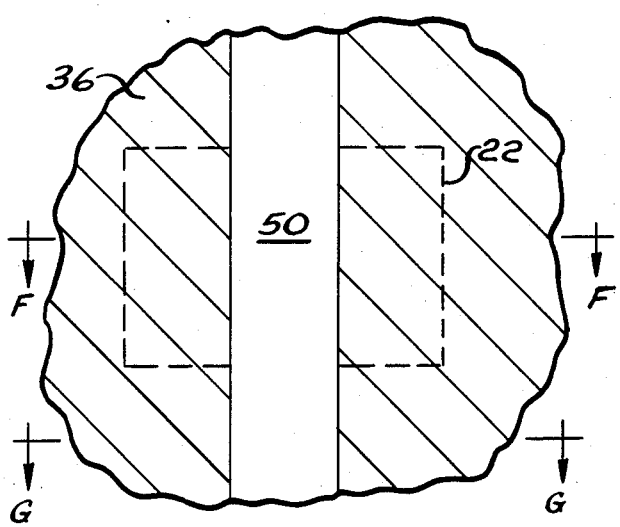
FIG. 12 is a plan view useful in understanding the alternate embodiment of the present invention and shows a mask used for defining both the polycide line and the polysilicon resistor.
Figure 13:
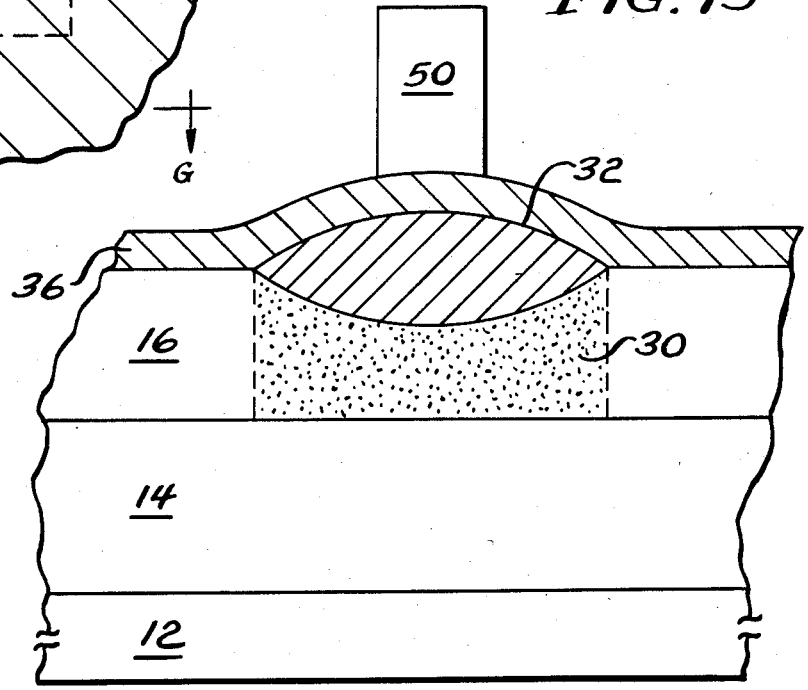
FIG. 13 is a sectional view along the line F—F of FIG. 12 showing photoresist on top of the silicide layer.

The second embodiment begins with the sectional view illustrated in FIG. 5 having a layer of silicide covering the thick oxide 32 which covers the boron-doped polysilicon region 30. The silicide 36 also covers other areas of the polysilicon layer 16. In this alternate embodiment, the resistor is aligned to the polycide lines because both the resistor and the polycide lines are defined in one mask. Thus, FIG. 12 shows in plan view of a polysilicon definition mask 50 comprising photoresist on top of the silicide layer 36. Photoresist 50 crosses over the rectangle 22 in which the thick oxide 32 has been grown but which is not visible in FIG. 12 because of the layer of silicide 36 on top of it. The oxide 32 is shown, however, in FIG. 13 which is a sectional view through the resistive polysilicon region 30 along lines F—F of FIG. 12.

Figure 14:
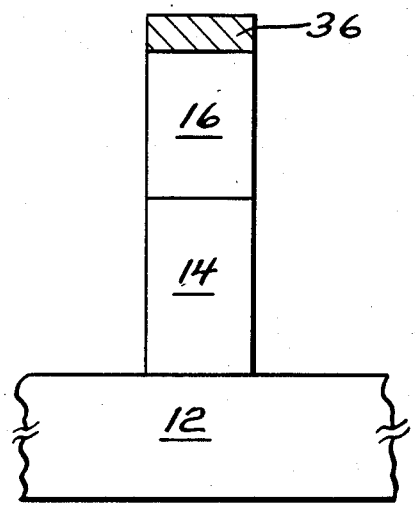
FIG. 14 is a sectional view along the line G—G of FIG. 12 after the FIG. 12 structure has been etched.
Figure 15:
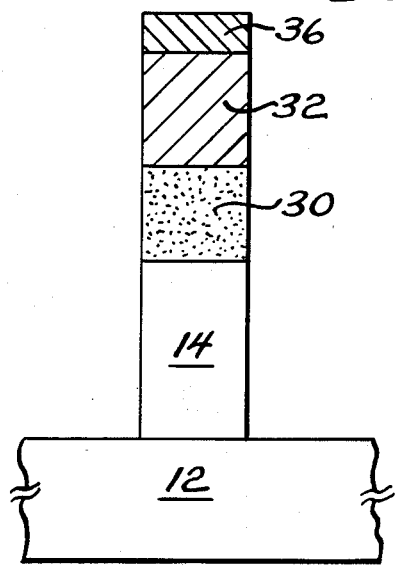
FIG. 15 is another sectional view of the structure of FIG. 12 along the lines of F—F to show the structure of the polysilicon resistor covered by silicide after FIG. 12 has been etched.

The silicide layer 36 and then the oxide 32 are etched ultimately to result in polysilicon lines shown in cross-sectional views in FIGS. 14 and 15 (the photoresist 50 having been removed). FIG. 15 is a sectional view through lines F—F of FIG. 12 showing the now-defined polysilicon resistor. It has a boron-doped polysilicon resistive region 30. Above it is thick oxide 32, and above that is silicide 36. FIG. 14 is a sectional view through lines G—G of FIG. 12 and shows the polycide line outside of the resistor. The polycide line has heavily doped conductive polysilicon 16 covered by silicide 36. It will be noted that the thickness of the polysilicon 16 outside the resistor, i.e., in FIG. 14 is greater than the thickness of the boron-doped poly 30 in the resistor (FIG. 15). This is due to the oxidation of the upper part of the polysilicon 16 in rectangle 22 to form thick oxide 32. This will have the advantage of adjusting the etch completion times for etching completely through resistive, lightly doped polysilicon 30 and heavily doped conductive polysilicon 16, terminating at substantially the same time.

The next step is to deposit or grow oxide on the sides and top of the polycide line for the source/drain implants. An example of a deposited oxide 52 is shown in FIG. 16. It covers the whole polycide line and results in a controlled separation of the source/drain implants from the edges of the gate electrode formed by the polycide line where it crosses an active area. In this embodiment, as in the first embodiment, the oxide 52, the silicide 36 and the oxide 32 protect the resistive polysilicon region 30 from the source/drain implants.

Figure 17:
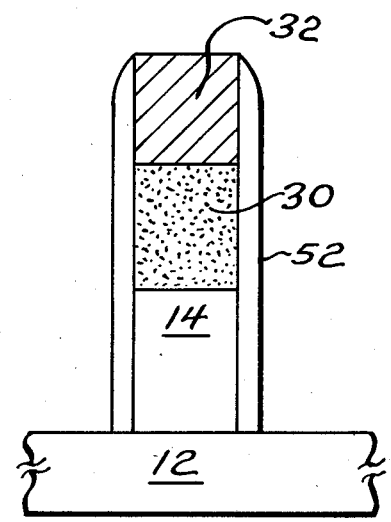
FIG. 17 is another sectional view showing the structure of FIG. 16 after one type of etching which leaves oxide on top of the polysilicon resistor.
Figure 18:
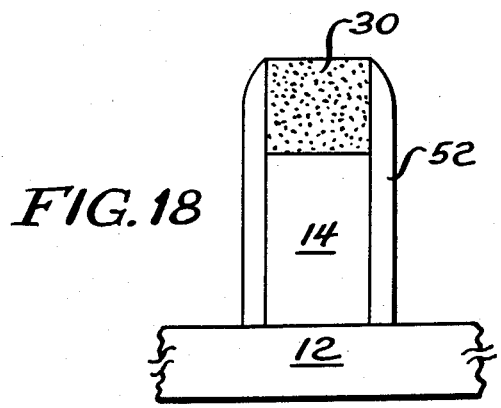
FIG. 18 is another view of the structure of FIG. 16 after etching of the type which removes both the zero drain overlap oxide, the underlying silicide, and a relatively thick oxide which had covered the designated resistor region.

Next, photoresist is added to cover only the former rectangle 22 (or at least the defined polysilicon resistor), and etching is done in known fashion to etch oxide and the silicide. The thick oxide 32 is preferably not etched substantially, as shown in FIG. 17, although it can be etched off to result in the structure shown sectionally in FIG. 18.

A major advantage of this alternate embodiment is that the resistor is self-aligned to the polycide line. Also, the oxide 32 need not be quite as thick as in the first embodiment because silicide 36 and an outer oxide 52 will protect the resistive region 30 from source/drain implants. A further advantage is that only one photo step is used for resistor implant, poly doping, and source/drain implant. As with the first embodiment, one great advantage of the process is that silicide never directly contacts resistive, boron-doped polysilicon which will be defined into resistors.

To recapitulate, this process in its alternate embodiment is the same as the first embodiment up through the step of depositing silicide over the structure. Then, the steps are:

11A. Add polysilicon definition mask of photoresist.
12A. Etch silicide, oxide and polysilicon.
13A. Remove photoresist.
14A. Establish oxide for zero drain overlap.
15A. Implant source/drain.
16A. Cover structure with photoresist except over resistor areas.
17A. Etch oxide and silicide.
18A. Etch the thick oxide from top of resistor (optional step).

Those skilled in the art will find other modifications of these embodiments which are within the scope and spirit of the present invention. The foregoing descriptions of first and second embodiments are illustrative.

What is claimed as the invention is:

1. A method for fabricating a polysilicon resistor in a polycide line, including the steps of:
    establishing a protective material on top of a polysilicon region designated for location of the polysilicon resistor before silicide contacts said region; then
    adding silicide over the polysilicon; and
    defining the silicide and polysilicon to result in a polysilicon resistor in contact with a polycide line, the resistor being protected from the silicide.

2. The method of claim 1 wherein said establishing step includes:
    establishing a layer of polysilicon;
    doping said designated polysilicon region with impurities for a polysilicon resistor; and
    establishing said protective material.

3. The method of claim 2 wherein said establishing said protective material step includes developing an oxide on top of said designated polysilicon region.

4. The method of claim 3 wherein said step there defined comprises oxidizing said designated polysilicon region, and wherein the method includes establishing an oxidation-inhibiting layer outside said designated polysilicon region.

5. The method of claim 1 wherein said protective material is established on top of an area larger than and encompassing said designated resistor region.

6. The method of claim 5 including simultaneously defining both the polycide line and the polysilicon resistor.

7. The method of claim 6 wherein said method includes establishing photoresist over the silicide and said area encompassing said designated resistor region, and etching silicide, the protective layer, and polysilicon.

8. The method of claim 5 including defining the polycide line prior to defining the polysilicon into a resistor in the designated resistor region.

9. The method of claim 8 comprising establishing a photoresist on top of the silicide and in a line extending across said larger area, but being discontinuous over said larger area, then etching through the silicide not covered by said photoresist down to said protective material, and thereafter defining said designated resistor region into the polysilicon resistor.

10. The method of claim 1 including:
    covering a layer of polysilicon in which the resistor and polycide lines are to be formed with a layer of oxidation-inhibiting material;
    etching an opening through said oxidation-inhibiting layer to delineate a region encompassing said designated resistor region;
    implanting impurities into the polysilicon through said opening;
    establishing a relatively thick oxide in said opening on top of the polysilicon for preventing subsequently added silicide from contacting the polysilicon in the designated resistor region;
    adding a layer of silicide covering the polysilicon and said oxide thereon; and
    defining a polysilicon line passing through the designated resistor area.

11. The method of claim 10 wherein said oxide is grown in said opening.

12. The method of claim 10 wherein said oxidation-inhibiting material is a nitride.

13. The method of claim 12 wherein said oxide is grown.

14. The method of claim 10 further including removing said oxidation-inhibiting layer prior to said step of adding a silicide.

* * * * *